United States Patent
Choi et al.

(10) Patent No.: US 9,246,115 B2
(45) Date of Patent: Jan. 26, 2016

(54) ORGANIC SOLAR CELL AND METHOD OF MANUFACTURING THE SAME

(75) Inventors: Miri Choi, Incheon (KR); Tae-Woo Lee, Pohang-si (KR)

(73) Assignee: POSTECH ACADEMY-INDUSTRY FOUNDATION, Pohang-Si, Kyungsangbuk-Do (KR)

( * ) Notice: Subject to any disclaimer, the term of this patent is extended or adjusted under 35 U.S.C. 154(b) by 959 days.

(21) Appl. No.: 13/270,629

(22) Filed: Oct. 11, 2011

(65) Prior Publication Data

US 2012/0085413 A1    Apr. 12, 2012

(30) Foreign Application Priority Data

Oct. 11, 2010  (KR) .................. 10-2010-0098997

(51) Int. Cl.
| | | |
|---|---|---|
| *H01L 51/46* | (2006.01) | |
| *H01L 51/44* | (2006.01) | |
| *H01L 51/42* | (2006.01) | |
| *B82Y 10/00* | (2011.01) | |
| *C09D 125/18* | (2006.01) | |
| *H01L 51/00* | (2006.01) | |

(52) U.S. Cl.
CPC ............. *H01L 51/4246* (2013.01); *B82Y 10/00* (2013.01); *C09D 125/18* (2013.01); *H01L 51/0003* (2013.01); *H01L 51/0036* (2013.01); *H01L 51/0047* (2013.01); *H01L 51/4253* (2013.01); *Y02E 10/549* (2013.01)

(58) Field of Classification Search
CPC .................................................... Y02E 10/549
See application file for complete search history.

(56) References Cited

U.S. PATENT DOCUMENTS

| 2006/0180810 | A1 | 8/2006 | Lee et al. | |
|---|---|---|---|---|
| 2010/0140594 | A1* | 6/2010 | Meng et al. | 257/40 |
| 2010/0237294 | A1* | 9/2010 | Lee et al. | 252/500 |
| 2012/0261652 | A1 | 10/2012 | Rothe et al. | |
| 2013/0019937 | A1* | 1/2013 | So et al. | 136/256 |

FOREIGN PATENT DOCUMENTS

| JP | 2003-317963 | 11/2003 |
|---|---|---|
| JP | 2006-225658 | 8/2006 |
| JP | 2010-135716 | 6/2010 |
| JP | 2012-509285 | 4/2012 |
| KR | 10-2008-0012015 | 2/2008 |
| KR | 10-2008-0091311 | 10/2008 |

OTHER PUBLICATIONS

Wu et al., "Light emitting electrochemical devices from sequentially adsorbed multilayers of a polymeric ruthenium (II) complex and various polyanions," Thin Solid Films 327-329 (1998) 663-667.*
Senapati, Advanced Engineering Chemistry, 12.1 (2006.).*
Aiping Wu et al., "Light emitting electrochemical devices from sequentially adsorbed multilayers of a polymeric ruthenium (II) complex and various polyanions", Thin Solid Films, 327-329 (1998) pp. 663-667.

(Continued)

*Primary Examiner* — Ling Choi
*Assistant Examiner* — Catherine S Branch
(74) *Attorney, Agent, or Firm* — Kile Park Reed & Houtteman PLLC (57) ABSTRACT

An organic solar cell and a method of manufacturing the same.

6 Claims, 2 Drawing Sheets

(56) References Cited

OTHER PUBLICATIONS

Qingshuo Wei et al.; "Self-Organized Buffer Layers in Organic Solar Cells", Advanced Materials, 2008, vol. 20, pp. 2211-2216.

Seung-Hwan Oh et al, "Water-Soluble Polyfluorenes as an Interfacial Layer Leading to Cathode-Independent High Performance of Organic Solar Cells"; Advanced Functional Materials, 2010, 20, pp. 1977-1983.

* cited by examiner

ORGANIC SOLAR CELL AND METHOD OF MANUFACTURING THE SAME

CROSS-REFERENCE TO RELATED PATENT APPLICATION

This application claims the benefit of Korean Patent Application No. 10-2010-0098997, filed on Oct. 11, 2010, in the Korean Intellectual Property Office, the disclosure of which is incorporated herein by reference.

BACKGROUND OF THE INVENTION

1. Field of the Invention

The present invention relates to an organic solar cell and a method of manufacturing the same.

2. Description of the Related Art

Amid rising interests in renewable energy increasing worldwide, organic solar cells are currently drawing attention as a promising future energy source having a variety of advantages.

Compared with inorganic solar cells using silicon, organic solar cells may be manufactured as a thin film at low cost and may be applicable to various types of flexible devices.

Therefore, to further improve characteristics of organic solar cells research and development have been conducted in respect to various aspects. As an example, attempts have been made to improve characteristics of a photoactive layer of an organic solar cell by thermal treatment of a photoactive layer material, surface treatment of the photoactive layer, or the like.

However, improvement of a photoelectric conversion efficiency of the organic solar cell and reduction of manufacturing costs are still necessary.

SUMMARY OF THE INVENTION

The present invention relates to an organic solar cell that may be implemented at low cost, and a method of manufacturing the organic solar cell.

According to an aspect of the present invention, there is provided an organic solar cell including: a first electrode; a second electrode; a photoactive layer disposed between the first electrode and the second electrode; and an electron extraction layer disposed between the photoactive layer and the second electrode, wherein the electron extraction layer comprises an ionic polymer.

The ionic polymer may include at least one substituent represented by Formula 1A below:

Formula 1A wherein, in Formula 1A, a is an integer from 0 to 30;
$L_1$ is —O—, a substituted unsubstituted $C_1$-$C_{10}$ alkylene group, a substituted or unsubstituted $C_2$-$C_{10}$ alkenylene group, a substituted or unsubstituted $C_6$-$C_{20}$ arylene group, or a substituted or unsubstituted $C_3$-$C_{20}$ heteroarylene group;
p is an integer from 1 to 10;
$A_1$ is —$CO_2M_1$, —$SO_3M_1$, or —$PO_3M_1M_2$; and
$M_1$ and $M_2$ are each independently a monovalent cation.
$L_1$ in Formula 1A may be —O—, a methylene group, an ethylene group, a propylene group, a butylene group, a phenylene group, a naphthylene group, or an anthrylene group.

$M_1$ and $M_2$ in Formula 1A may be each independently a hydrogen atom or an alkaline metal.

The substituent represented by Formula 1A may be a substituent represented by one of Formulae 10A to 10E below:

Formula 10A

Formula 10B

Formula 10C

Formula 10D

Formula 10E wherein, in Formulae 10A to 10E, $M_1$ is H, Li, Na, or K.

The ionic polymer may include at least one of a repeating unit represented by Formula 2A below, a repeating unit represented by Formula 3A below, a repeating unit represented by Formula 4A below, a repeating unit represented by Formula 5A below, a repeating unit represented by Formula 6A below, and a repeating unit represented by Formula 7A below:

Formula 2A

Formula 3A

Formula 4A

Formula 5A

Formula 6A

Formula 7A wherein, in Formulae 2A to 7A, $Ar_1$ to $Ar_3$ are each independently a $C_1$-$C_{30}$ alkylene group, a $C_6$-$C_{30}$ arylene group, a $C_3$-$C_{30}$ heteroarylene group, a $C_5$-$C_{30}$ cycloalkylene group, a $C_1$-$C_{30}$ alkylene group substituted with at least one first group, a $C_6$-$C_{30}$ arylene group substituted with at least one second group, a $C_3$-$C_{30}$ heteroarylene group substituted with at least one third group, or a $C_5$-$C_{30}$ cycloalkylene group substituted with at least one fourth group;

b to d are each independently an integer from 1 to 20; and R$_1$ to R$_4$, R$_{11}$, R$_{13}$, R$_{14}$, R$_{15}$, the first group, the second group, the third group, and the fourth group are each independently a hydrogen atom (H), a nitro group (—NO$_2$), a cyano group (—CN), a hydroxyl group (—OH), a halogen atom, a substituted or unsubstituted C$_1$-C$_{30}$ alkyl group, a substituted or unsubstituted C$_1$-C$_{30}$ alkoxy group, a substituted or unsubstituted C$_6$-C$_{30}$ aryl group, a substituted or unsubstituted C$_6$-C$_{30}$ arylalkyl group, a substituted or unsubstituted C$_6$-C$_{30}$ aryloxy group, a substituted or unsubstituted C$_2$-C$_{30}$ heteroaryl group, a substituted or unsubstituted C$_2$-C$_{30}$ heteroarylalkyl group, a substituted or unsubstituted C$_2$-C$_{30}$ heteroaryloxy group, a substituted or unsubstituted C$_5$-C$_{20}$ cycloalkyl group, a substituted or unsubstituted C$_2$-C$_{30}$ heterocycloalkyl group, a substituted or unsubstituted C$_1$-C$_{30}$ alkylester group, a substituted or unsubstituted C$_6$-C$_{30}$ arylester group, a substituted or unsubstituted C$_2$-C$_{30}$ heteroarylester group, —N(Q$_1$)(Q$_2$), —C(=O)—NH$_2$, or a substituent represented by Formula 1A below, wherein Q$_1$ to Q$_2$ are each independently a hydrogen atom, a C$_1$-C$_{30}$ alkyl group, a C$_6$-C$_{30}$ aryl group, or a C$_2$-C$_{30}$ heteroaryl group, and at least one of R$_1$ to R$_4$, R$_{11}$, R$_{13}$, R$_{14}$, R$_{15}$, the first group, the second group, the third group, and the fourth group is a substituent represented by Formula 1A above.

The ionic polymer may include a repeating unit represented by Formula 8A below with a terminal to which a substituent represented by Formula 1A above:

Formula 8A wherein, in Formula 8A, R$_{21}$ to R$_{24}$ are each independently a hydrogen atom (H), a nitro group (—NO$_2$), a cyano group (—CN), a hydroxyl group (—OH), a halogen atom, a substituted or unsubstituted C$_1$-C$_{30}$ alkyl group, a substituted or unsubstituted C$_1$-C$_{30}$ alkoxy group, a substituted or unsubstituted C$_6$-C$_{30}$ aryl group, a substituted or unsubstituted C$_6$-C$_{30}$ arylalkyl group, a substituted or unsubstituted C$_6$-C$_{30}$ aryloxy group, a substituted or unsubstituted C$_2$-C$_{30}$ heteroaryl group, a substituted or unsubstituted C$_2$-C$_{30}$ heteroarylalkyl group, a substituted or unsubstituted C$_2$-C$_{30}$ heteroaryloxy group, a substituted or unsubstituted C$_5$-C$_{20}$ cycloalkyl group, a substituted or unsubstituted C$_2$-C$_{30}$ heterocycloalkyl group, a substituted or unsubstituted C$_1$-C$_{30}$ alkylester group, a substituted or unsubstituted C$_6$-C$_{30}$ arylester group, a substituted or unsubstituted C$_2$-C$_{30}$ heteroarylester group, —N(Q$_1$)(Q$_2$), or —C(=O)—NH$_2$, wherein Q$_1$ to Q$_2$ are each independently a hydrogen atom, a C$_1$-C$_{30}$ alkyl group, a C$_6$-C$_{30}$ aryl group, or a C$_2$-C$_{30}$ heteroaryl group.

The ionic polymer may have a weight average molecular weight (Mw) of from about 1,000 to about 90,000,000.

The electron extraction layer may have a thickness of from about 0.1 nm to about 10 nm.

One surface of the electron extraction layer and one surface of the second electrode may contact each other.

According to another aspect of the present invention, there is provided a method of manufacturing an organic solar cell, the method including: forming a first electrode on a substrate; forming a photoactive layer on the first electrode; forming an electron extraction layer comprising an ionic polymer on the photoactive layer; and forming a second electrode on the electron extraction layer, wherein the forming of the electron extraction layer may include forming a first layer from a mixture of the ionic polymer and a solvent; and removing at least part of the solvent from the first layer to obtain the electron extraction layer.

The forming of the first layer in the forming of the electron extraction layer may be performed using spin coating, inkjet printing, nozzle printing, dip coating, electrophoresis, tape casting, screen printing, doctor blade coating, gravure printing, gravure offset printing, a Langmuir-Blogett method, or a layer-by-layer self-assembly method.

BRIEF DESCRIPTION OF THE DRAWINGS

The above and other features and advantages of the present invention will become more apparent by describing in detail exemplary embodiments thereof with reference to the attached drawing in which.

DETAILED DESCRIPTION OF THE INVENTION

The present disclosure will now be described more fully with reference to the accompanying drawings, in which exemplary embodiments of the present disclosure are shown.

Figure 1:
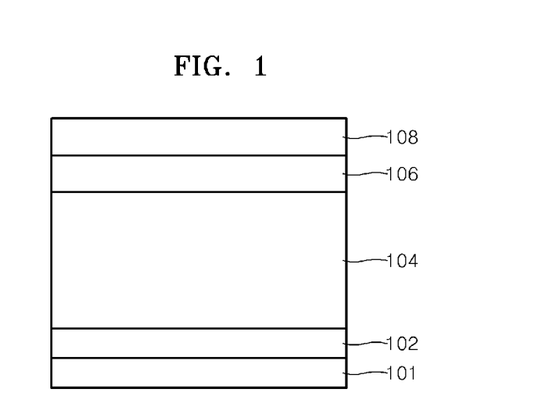
FIG. 1 is a schematic cross-sectional view of an organic solar cell according to an embodiment of the present invention.

FIG. 1 is a schematic cross-sectional view of an organic solar cell according to an embodiment of the present disclosure. Referring to FIG. 1, the organic solar cell according to the present embodiment includes a first electrode 101, a hole extraction layer 102, a photoactive layer 104, an electron extraction layer 106, and a second electrode 108, which are sequentially stacked in the stated order.

The first electrode 101 may be formed on a substrate (not shown). The substrate may be a substrate (for example, a silicon substrate and the like) used in general semiconductor manufacturing processes or a substrate made of a substantially transparent material (colorless and transparent, colored transparent, or translucent) that allows external light such as solar light to pass therethrough. Examples of the substrate include glass substrates, metal oxide substrates, and polymer substrates. Non-limiting examples of metal oxides for the substrate include aluminum oxide, molybdenum oxide, and indium tin oxide. Non-limiting examples of polymers for the substrate include polyethersulphone (PES), polyacrylate (PAR), polyetherimide (PEI), polyethylene napthalate (PEN), polyethylene tereptphalate (PET), polyphenylene sulfide (PPS), polyallylate, polyimide, polycarbonate (PC), cellulose triacetate (TAC), and cellulose acetate propinonate (CAP). The substrate may have a single layer structure consisting of a mixture of at least one material, and in another embodiment, may have a multi-layer structure including a stack of layers, each consisting of at least two kinds of materials.

The first electrode 101 may be an anode. A material for the first electrode 101 may have a high work function. Examples of the material for the first electrode 101 include transparent and highly conductive materials, such as indium tin oxide (ITO), indium zinc oxide (IZO), tin oxide (SnO$_2$), zinc oxide (ZnO), fluorine tin oxide (FTO), and antimony tin oxide (ATO). Other examples of the material for the first electrode 13 include magnesium (Mg), aluminum (Al), platinum (Pt), silver (Ag), gold (Au), copper (Cu), molybdenum (Mo), titanium (Ti), tantalum (Ta), a combination of at least two thereof (for example, an alloy thereof, aluminum-lithium, calcium (Ca), magnesium-indium (Mg—In), or magnesium-silver (Mg—Ag), which may be in a co-deposition layer), and carbonaceous materials such as graphite. The first electrode 101 may include two different materials. The first electrode 101 may have any of various structures, and in some embodiments, may have a double-layer structure including two different materials. The first electrode 101 may be formed using any of various known methods, for example, sputtering, deposition (vapor deposition, thermal deposition, or the like), ion beam assisted deposition (IBAD), or wet coating, which are selected depending on the material for the first electrolyte 101.

The hole extraction layer 102 may be disposed on the first electrode 101. The hole extraction layer 102 may capture holes generated in the photoactive layer 104 and transfer them to the first electrode 101.

A material for the hole extraction layer 102 may be a conductive polymer. Non-limiting examples of the conductive polymer include PEDOT:PSS (poly(3,4-ethylenedioxythiophene):poly(styrenesulfonate)), polyaniline, polydiphenyl, acetylene, poly(t-butyl)diphenylacetylene, poly(trifluoromethyl)diphenylacetylene, Cu-PC (copper phthalocyanine) poly(bistrifluoromethyl)acetylene, polybis(T-butyldiphenyl)acetylene, poly(trimethylsilyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsilyl)phenylacetylene, derivatives thereof, and a combination of at least two thereof.

For example, the material for the hole extraction layer 102 may be PEDOT:PSS (poly(3,4-ethylenedioxythiophene):poly(styrenesulfonate)).

The hole extraction layer 102 may be formed using any of various known methods, for example, deposition (vapor deposition, thermal deposition, or the like), ion beam assisted deposition (IBAD), or wet coating, which are selected depending on the material for the hole extraction layer 102.

The hole extraction layer 102 may have a thickness of from about 1 nm to about 500 nm. When the thickness of the hole extraction layer 102 is within this range, the hole extraction layer 102 may exhibit good hole extraction performance without a substantial increase in driving voltage.

The photoactive layer 104 may be disposed on the hole extraction layer 102. The photoactive layer 104 may generate holes and electrons by absorbing external light such as solar light.

The photoactive layer 104 may have any of a variety of structures, for example, a single layer structure including an electron donor material and an electron acceptor material, or a multi-layer structure including an electron donor material-containing layer and an electron acceptor material-containing layer.

The electron donor material may be a p-type conductive polymer material including a π-electron. Non-limiting examples of the conductive polymer as an electron donor material include P3HT (poly(3-hexylthiophene)), polysiloxane carbazole, polyaniline, polyethylene oxide, (poly(1-methoxy-4-(O-disperse red1)-2,5-phenylene-vinylene), MEH-PPV (poly-[2-methoxy-5-(2'-ethoxyhexyloxy)-1,4-phenylene vinylene]); MDMO-PPV (poly[2-methoxy-5-3 (3',7'-dimethyloctyloxy)-1,4-phenylene vinylene]); PFDTBT (poly(2,7-(9,9-dioctyl)-fluorene-alt-5,5-(4',7'-di-2-thienyl-2',1',3'-benzothiadiazole)); PCPDTBT (poly[N',0'-heptadecanyl-2,7-carbazole-alt-5,5-(4',7'-di-2-thienyl-2',1', 3'-benzothiazole)], PCDTBT (poly[N-9'-heptadecanyl-2,7-carbazole-alt-5,5-(4',7'-di-2-thienyl-2',1',3'-benzothiadiazole)])polyindole, polycarbazole, polypyridiazine, polyisothianaphthalene, polyphenylene sulfide, polyvinylpyridine, polythiophene, polyfluorene, polypyridine, and derivatives thereof. Any combination of at least two of the above-listed electron donor materials, for example, as a blend or a copolymer, may be used.

Non-limiting examples of the electron acceptor material include fullerene, a derivative thereof (for example, PCBM ([6,6]-phenyl-C61 butyric acid methyl ester)), nanocrystals such as CdSe, carbon nanotubes, polybenzimidazole (FBI) nanorods, and 3,4,9,10-perylenetetracarboxylic bisbenzimidazole (PTCBI).

The photoactive layer 104 may be a single layer including P3HT as an electron donor material, and fullerene derivative PCBM ([6,6]-phenyl-C61 butyric acid methyl ester) as an electron acceptor material, but is not limited thereto.

When the photoactive layer 104 includes a mixture of an electron donor material and an electron acceptor material, a mixing ratio of the electron donor material to the electron acceptor material may be from 10:1 to 10:100 by weight, but is not limited thereto.

The photoactive layer 104 may have a thickness of, for example, from about 10 nm to about 2000 nm. The photoactive layer 104 may be formed using a general deposition method or a coating method, for example, using spraying, spin coating, dipping, printing, a doctor blade method, sputtering, or electrophoresis. However, any appropriate method may be used.

The electron extraction layer 106 may be disposed on the photoactive layer 104. The electron extraction layer 106 may capture electrons generated in the photoactive layer 104 and transfer them to the second electrode 108.

The electron extraction layer 106 may include an ionic polymer. As a result, an increased difference in work function between the first electrode 101 and the second electrode 108 may lead to an increased open circuit voltage ($V_{OC}$) of an organic solar cell, thus facilitating migration of electrons from the photoactive layer 104 to the second electrode 108 and resulting in an increased short circuit current ($J_{SC}$). Therefore, the organic solar cell with the electron extraction layer 106 including the ionic polymer may have an improved photoelectric conversion efficiency.

Figure 2:
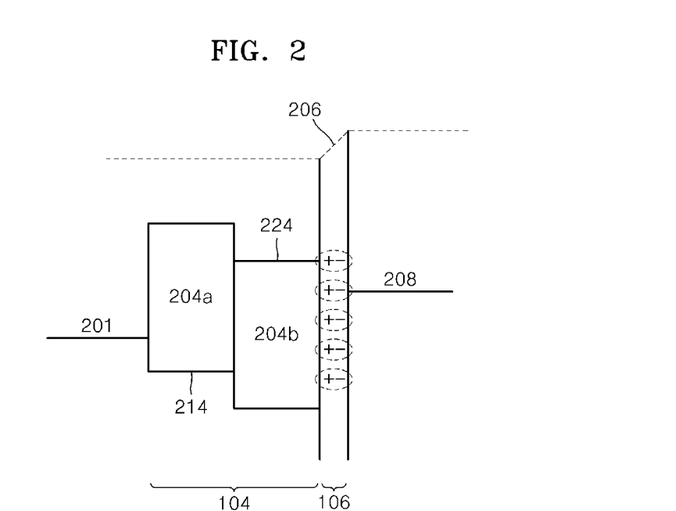
FIG. 2 is an energy level diagram of each layer of the organic solar cell of FIG. 1.

FIG. 2 is an energy level diagram of each layer of the organic solar cell in FIG. 1, illustrating an energy level 201 of the first electrode 101, a highest occupied molecular orbital (HOMO) 214 of an electron donor material 204a in the photoactive layer 104, a lowest unoccupied molecular orbital (LUMO) 224 of an electron acceptor material 204b in the photoactive layer 104, and an energy level 208 of the second electrode 108. Although the energy level of the photoactive layer 104 is illustrated separately for a layer containing the electron donor material 204a and a layer containing the electron acceptor material 204b, the photoactive layer 104 of FIG. 2 is not limited to having a double layer structure including the electron donor material-containing layer and the electron acceptor-containing layer. For convenience of illustration, an energy level of the hole extraction layer 102 is not illustrated in FIG. 2.

Referring to FIGS. 1 and 2, holes generated in the photoactive layer 104 of the organic solar cell by exposure to external light such as solar light migrate to the first electrode 101 from the HOMO 214 of the electron donor material 204a, while electrons generated in the photoactive layer 104 migrate from the LUMO 224 of the electron acceptor material 204b to the second electrode 108 via the electron extraction layer 106.

The inclusion of the ionic polymer in the electron extraction layer 106 may cause formation of a "dipole layer" including a positive charge region (δ+) and a negative charge region (δ−), as illustrated in FIG. 2, so that a vacuum energy level (denoted by dotted lines 206 in FIG. 2) may be shifted upward. This may result in an increased difference in work function between the first electrode 101 and the second electrode 108, and thus an increased open circuit voltage of the organic solar cell. In some embodiments the vacuum energy level may be shifted above by 0.05 eV or greater. However, the present disclosure is not limited thereto.

The shift of the vacuum energy level (see the dotted line 206 of FIG. 2) may reduce the difference in work function between the LUMO 224 of the photoactive layer 104 and the second electrode 108 to facilitate the transfer of electrons generated in the photoactive layer 104 to the second electrode 108. Thus, the organic solar cell may have an increased short circuit current.

The ionic polymer in the electron extraction layer 106 may have a dipole moment of 0.3 debye or greater, and in some embodiments, may have a dipole moment of about 0.36 debye to about 12 debye. These data were measured using toluene as a solvent at about 38.4° C. When the ionic polymer in the electron extraction layer 106 has a dipole moment within these ranges, such a shift in vacuum energy level as illustrated in FIG. 2 (denoted by the dotted line 206 in FIG. 2) may be facilitated.

The ionic polymer may include at least one substituent represented by Formula 1A:

Formula 1A

In Formula 1A, a may be an integer from 0 to 30. In some embodiments, if a is 0, $A_1$ may be directly linked to a main chain of the ionic polymer. a may be an integer randomly selected from among 0 to 30.

In Formula 1A, $L_1$ may be —O—, a substituted or unsubstituted $C_1$-$C_{10}$ alkylene group, a substituted or unsubstituted $C_2$-$C_{10}$ alkenylene group, a substituted or unsubstituted $C_6$-$C_{20}$ arylene group, or a substituted or unsubstituted $C_3$-$C_{20}$ heteroarylene group. For example, $L_1$ may be —O—, a $C_1$-$C_5$ alkylene group, a $C_2$-$C_5$ alkenylene group, a $C_6$-$C_{14}$ arylene group, or a $C_2$-$C_{14}$ heteroarylene group. For example, $L_1$ may be —O—, a methylene group, an ethylene group, a propylene group, a butylene group, a phenylene group, a naphthylene group, or an anthrylene group, but is not limited thereto. In some embodiments, if a is 2, $L_1$ may be —O— or a propylene group.

In Formula 1A, p is an integer from 1 to 10. p may depend on $L_1$. For example, p may be 1, 2, 3, or 4, but is not limited thereto.

In Formula 1A, $A_1$ may be —$CO_2M_1$, —$SO_3M_1$, or —$PO_3M_1M_2$.

$M_1$ and $M_2$ may be each independently a hydrogen atom or an alkaline metal, such as Li, Na, or K.

The substituent suggested by Formula 1A may be, but is not limited to, a substituent represented by one of the Formulae 10A to 10E below:

Formula 10A

Formula 10B

Formula 10C

Formula 10D

Formula 10E

In Formulae 10A to 10E, $M_1$ is H, Li, Na, or K.

The ionic polymer in the electron extraction layer 106 may include at least one of a repeating unit represented by Formula 2A below, a repeating unit represented by Formula 3A below, a repeating unit represented by Formula 4A below, a repeating unit represented by Formula 5A below, a repeating unit represented by Formula 6A below, and a repeating unit represented by Formula 7A below.

Formula 2A

Formula 3A

Formula 4A

Formula 5A

Formula 6A

Formula 7A

In Formulae 2A to 7A, $Ar_1$ to $Ar_3$ may be each independently a $C_1$-$C_{30}$ alkylene group, a $C_6$-$C_{30}$ arylene group (for example, a phenylene group, a naphthylene group, an anthrylene group, a fluorenylene group, a spiro-fluorenylene group, or the like), a $C_3$-$C_{30}$ heteroarylene group (for example, a thiophenyl group, a pyrrolylene group, or the like), a $C_5$-$C_{30}$ cycloalkylene group (for example, a cyclohexylene group, or the like), a $C_1$-$C_{30}$ alkylene group substituted with at least one first group, a $C_6$-$C_{30}$ arylene group substituted with at least one second group (for example, a phenylene group, a naphthylene group, an anthrylene group, a fluorenylene group, or a spiro-fluorenylene group, which are substituted with at least one second group, or the like), a $C_3$-$C_{30}$ heteroarylene group substituted with at least one third group (for example, a thiophenyl group or a pyrrolylene group, which are substituted with at least one third group, or the like), or a cycloalkylene group substituted with at least one fourth group (for example, a cyclohexylene group substituted with at least one fourth group, or the like).

b to d may be each independently an integer from 1 to 20.

$R_1$ to $R_4$, $R_{11}$, $R_{13}$, $R_{14}$, $R_{15}$, the first group, the second group, the third group, and the fourth group may be each independently a hydrogen atom (H), a nitro group (—$NO_2$), a cyano group (—CN), a hydroxyl group (—OH), a halogen atom, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ arylalkyl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroarylalkyl group, a substituted or unsubstituted $C_2$-$C_{30}$ heteroaryloxy group, a substituted or unsubstituted $C_5$-$C_{20}$ cycloalkyl group, a substituted or unsubstituted $C_2$-$C_{30}$ heterocycloalkyl group, a substituted or unsubstituted $C_1$-$C_{30}$ alkylester group, a substituted or unsubstituted $C_6$-$C_{30}$ arylester group, a substituted or unsubstituted $C_2$-$C_{30}$ heteroarylester group, —$N(Q_1)(Q_2)$, —$C(=O)$—$NH_2$, or a substituent represented by Formula 1A below, wherein $Q_1$ to $Q_2$ are each independently a hydrogen atom, a $C_1$-$C_{30}$ alkyl group, a $C_6$-$C_{30}$ aryl group, or a $C_2$-$C_{30}$ heteroaryl group, and at least one of $R_1$ to $R_4$, $R_{11}$, $R_{13}$, $R_{14}$, $R_{15}$, the first group, the second group, the third group, and the fourth group may be a substituent represented by Formula 1A above, which is described above, and will not be repeatedly described here.

The $R_1$ to $R_4$, $R_{11}$, $R_{13}$, $R_{14}$, $R_{15}$, the first group, the second group, the third group, and the fifth group are each independently, but are not limited to, a hydrogen atom, a $C_1$-$C_{10}$ alkyl group, a $C_1$-$C_{10}$ alkoxy group, a phenyl group, a naphthyl group, an anthryl group, or a substituent represented by Formula 1A above.

In some other embodiments, the ionic polymer may include a repeating unit represented by Formula 8A below with a terminal to which the substituent represented by Formula 1A above is bound:

Formula 8A

In Formula 8A, $R_{21}$ to $R_{24}$ may be each independently a hydrogen atom (H), a nitro group (—$NO_2$), a cyano group (—CN), a hydroxyl group (—OH), a halogen atom, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ arylalkyl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroarylalkyl group, a substituted or unsubstituted $C_2$-$C_{30}$ heteroaryloxy group, a substituted or unsubstituted $C_5$-$C_{20}$ cycloalkyl group, a substituted or unsubstituted $C_2$-$C_{30}$ heterocycloalkyl group, a substituted or unsubstituted $C_1$-$C_{30}$ alkylester group, a substituted or unsubstituted $C_6$-$C_{30}$ arylester group, a substituted or unsubstituted $C_2$-$C_{30}$ heteroarylester group, —$N(Q_1)(Q_2)$, or —$C(=O)$—$NH_2$, wherein $Q_1$ to $Q_2$ are each independently a hydrogen atom, a $C_1$-$C_{30}$ alkyl group, a $C_6$-$C_{30}$ aryl group, or a $C_2$-$C_{30}$ heteroaryl group. Formula 1A is described above, and will not be repeatedly described here.

The ionic polymer may be a homopolymer including only one repeating unit, for example, from among the repeating units represented by Formula 2A. In another embodiment, the ionic polymer may be a copolymer including two different repeating units, for example, from among the repeating units represented by Formula 2A. In another embodiment, the ionic polymer may be a copolymer, for example, including a repeating unit represented by Formula 2A and a repeating unit represented by Formula 3A. The ionic polymer is not limited to the above, and may be in any form within the range described above.

The ionic polymer of the electron extraction layer 106 may be represented by one of Formulae 30A to 30L below, but is not limited thereto:

Formula 30A

Formula 30B

Formula 30C

Formula 30D

-continued

Formula 30E

Formula 30F

Formula 30G

Formula 30H

Formula 30I

Formula 30J

Formula 30K

Formula 30L

In Formulae 30A to 30L, n, $n_1$, and $n_2$ may be each independently an integer from 10 to 1,000,000; and $M_1$ may be H, Li, Na, or K.

The ionic polymer may have a weight average molecular weight (Mw) of from about 1,000 to about 90,000,000, and in some embodiments, may have a $M_W$ of from about 10,000 to about 100,000. When the weight average molecular weight of the ionic polymer is within these ranges, the mixture for forming the electron extraction layer 106 may be improved in respect to coating property, viscosity, and flowability, so that the electron extraction layer 106 may have improved interfacial characteristics.

The electron extraction layer 106 may have a thickness of about 0.1 nm to about 10 nm, and in some embodiments, may have a thickness of about 1 nm to about 4 nm. When the thickness of the electron extraction layer 106 is within these ranges, a vacuum energy level shifting effect as illustrated in FIG. 2 may be obtained without an increase in driving voltage.

The electron extraction layer 106 may be formed by forming a first layer from a mixture of the ionic polymer and a solvent; and removing at least part of the solvent from the first layer to obtain the electron extraction layer. In other words, the electron extraction layer 106 may be formed by a so-called "wet process."

The solvent may be a material that does not react with the ionic polymer to be included in the electron extraction layer 106 but is miscible with the ionic polymer, and that may be readily removed by, for example, heat. In some embodiments, the solvent may be an alcohol, for example, ethyl alcohol, but is not limited thereto.

The first layer may be formed in a region where the electron extraction layer 106 is to be formed, from the mixture of the ionic polymer and the solvent. For example, the first layer may be formed on the photoactive layer 104.

The first layer may be formed using any known method, for example, using spin coating, inkjet printing, nozzle printing, dip coating, electrophoresis, tape casting, screen printing, doctor blade coating, gravure printing, gravure offset printing, a Langmuir-Blodgett method, or a layer-by-layer self-assembly method.

At least part of the solvent may be removed from the first layer, which is formed from the mixture of the ionic polymer and the solvent, by using any known method. In some embodiments, at least part of the solvent may be removed from the first layer by thermal treatment, vacuum drying or UV treatment. The resulting electron extraction layer 106 may include the ionic polymer.

As described above, the electron extraction layer 106 may be formed using a wet process. An organic solar cell including the electron extraction layer 106 formed as described above may have relatively low cost as compared to an organic solar cell including an electron extraction layer formed using a deposition method that needs an expensive vacuum chamber, evacuation equipment, or the like. When the electron extraction layer 106 is formed using such a wet process, the photoactive layer 104 underlying the electron extraction layer 106 may have minimized damage or may not be damaged, which may increase a fill factor of the organic solar cell.

The second electrode 108 may be disposed on the electron extraction layer 106. In one embodiment, the second electrode 108 may be "directly" disposed on the electron extraction layer 106, so that one surface of the electron extraction layer 106 directly contacts one surface of the second electrode 108 (see FIG. 1). In other words, an electron transport layer, for example, a LiF layer formed by deposition, may not be disposed between the electron extraction layer 106 and the second electrode 108.

The second electrode 108 may be a cathode. The second electrode 108 may be formed using a low work-function material to facilitate migration of electrons from the photoactive layer 104. Non-limiting examples of a material for the second electrode 108 include metals such as aluminum, magnesium, calcium, sodium, potassium, indium, yttrium, lithium, silver, lead, and cesium, and a combination of at least two thereof.

As used herein, "*" indicates a binding site with a neighboring element or repeating unit, which would be understood to one of ordinary skill in the art.

One or more embodiments of the present invention will now be described in detail with reference to the following examples. However, these examples are not intended to limit the scope of the one or more embodiments of the present invention.

EXAMPLES

Example 1

Poly(3,4-ethylenedioxythiophene):Poly(4-styrenesulfonate) (PEDOT:PSS) (CLEVIOS PH, available from H. C. Starck) was spin-coated on an ITO substrate (a glass substrate coated with ITO), and then thermally treated at about 200° C. for about 10 minutes to form a hole extraction layer having a thickness of about 35 nm. A mixture of 1,2-dichlorobenzene, PCBM and P3HT (PCBM:P3HT=1:1 by weight) was stirred at about 60° C. for about 8 hours and then cooled to room temperature. The resultant mixture was spin-coated on the hole extraction layer and then thermally treated at about 150° C. for about 30 minutes to form a photoactive layer having a thickness of about 210 nm. Subsequently, a mixture of poly(2,5-bis(3-sulfonatopropoxy)-1,4-phenylene disodium salt-alt-1,4-phenylene) (Product No. 659223, available from Sigma-Aldrich Co.) of Formula 30A ($M_1$=Na) and water was spin-coated on the photoactive layer, and then thermally treated at about 50° C. for about 10 minutes to form an ionic polymer-containing electron extraction layer having a thickness of about 2.7 nm. Then, Al was deposited on the electron extraction layer to form a second electrode having a thickness of about 100 nm, thereby completing the manufacture of an organic solar cell.

Comparative Example 1

An organic solar cell was manufactured in the same manner as in Example 1, except that the ionic polymer-containing electron extraction layer was not formed.

Evaluation Example 1

Figure 3:
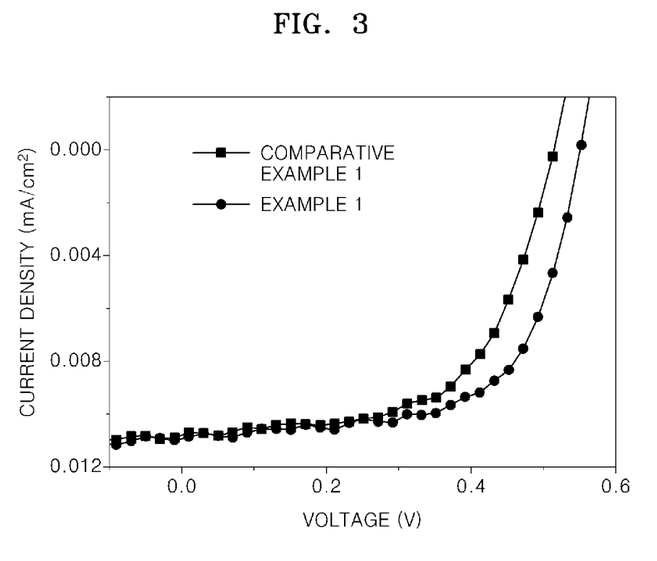
FIG. 3 is a graph illustrating the voltage-current characteristics of organic solar cells manufactured according to Example 1 and Comparative Example 1, respectively.

Voltage-current density characteristics of the organic solar cells of Example 1 and Comparative Example 1 were evaluated. The results are shown in FIG. 3. The voltage-current density characteristics of each organic solar cell were evaluated while irradiating a light of 100 mW/cm$^2$ onto the organic solar cell with a Xenon lamp as a light source (the AM 1.5 solar spectrum of the Xenon lamp was corrected using a standard solar cell).

A short circuit current ($J_{SC}$), an open circuit voltage ($V_{OC}$), a fill factor (FF), and a photoelectric conversion efficiency (PCE, %) were calculated using the voltage-current density graph. The results are shown in Table 1 below.

TABLE 1

| | Electron extraction layer | Open circuit voltage ($V_{OC}$) (mV) | Short circuit current ($J_{SC}$) (mA/cm$^2$) | Fill factor (FF) (%) | Photoelectric conversion efficiency (PCE) (%) |
|---|---|---|---|---|---|
| Comparative Example 1 | — | 501 | 10.9 | 59.6 | 3.3 |
| Example 1 | Ionic polymer of Formula 30A ($M_1$ = Na) | 534 | 11.0 | 62.3 | 3.7 |

Referring to Table 1, the organic solar cell of Example 1 with the electron extraction layer including the ionic polymer was found as having better characteristics as compared with the organic solar cell of Comparative Example 1.

The organic solar cell of Example 1 has an improved photoelectric conversion efficiency, and may be readily implemented as a thin film at low cost.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic solar cell comprising:
   a first electrode;
   a second electrode;
   a photoactive layer disposed between the first electrode and the second electrode; and
   an electron extraction layer disposed between the photoactive layer and the second electrode,
   wherein the electron extraction layer comprises an ionic polymer and is a dipole layer including a positive charge region (δ+) and a negative charge region (δ−) within the electron extraction layer, wherein the ionic polymer is represented by Formula 30A below:

[Formula 30A]

wherein $n_1$ is an integer from 10 to 1,000,000, and $M_1$ is H, Li, Na or K.

2. The organic solar cell of claim 1, wherein the ionic polymer has a weight average molecular weight (Mw) of from about 1,000 to about 90,000,000.

3. The organic solar cell of claim 1, wherein the electron extraction layer has a thickness of from about 0.1 nm to about 10 nm.

4. The organic solar cell of claim 1, wherein one surface of the electron extraction layer and one surface of the second electrode contact each other.

5. A method of manufacturing an organic solar cell, the method comprising:
forming a first electrode on a substrate;
forming a photoactive layer on the first electrode;
forming an electron extraction layer comprising an ionic polymer on the photoactive layer; and
forming a second electrode on the electron extraction layer,
wherein the forming of the electron extraction layer comprises forming a first layer from a mixture of the ionic polymer and a solvent; and removing at least part of the solvent from the first layer to obtain the electron extraction layer,
wherein the electron extraction layer is a dipole layer including a positive charge region (δ+) and a negative charge region (δ−) within the electron extraction layer,
wherein the ionic polymer is represented by Formula 30A below:

[Formula 30A]

wherein $n_1$ is an integer from 10 to 1,000,000, and $M_1$ is H, Li, Na or K.

6. The method of claim 5, wherein the forming of the first layer in the forming of the electron extraction layer is performed using spin coating, inkjet printing, nozzle printing, dip coating, electrophoresis, tape casting, screen printing, doctor blade coating, gravure printing, gravure offset printing, a Langmuir-Blogett method, or a layer-by-layer self-assembly method.

* * * * *